United States Patent
Hashimoto et al.

(10) Patent No.: US 6,226,181 B1
(45) Date of Patent: May 1, 2001

(54) CONTROLLER WITH SERVO AMPLIFIER INCORPORATED IN CABINET

(75) Inventors: Yoshiki Hashimoto, Hadano; Yasuyuki Shimoda, Oshino-mura, both of (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 09/214,304

(22) PCT Filed: May 29, 1998

(86) PCT No.: PCT/JP98/02384

§ 371 Date: Jan. 4, 1999

§ 102(e) Date: Jan. 4, 1999

(87) PCT Pub. No.: WO98/54938

PCT Pub. Date: Dec. 3, 1998

(30) Foreign Application Priority Data

May 29, 1997 (JP) .................................................... 9-154295

(51) Int. Cl.[7] ...................................................... H05K 7/20
(52) U.S. Cl. .......................... 361/695; 361/704; 361/717; 361/796; 361/802; 174/16.3; 257/713; 248/27.1
(58) Field of Search ..................................... 361/704–710, 361/719, 717, 741, 756, 753, 799, 711, 715, 718, 722, 725, 728, 730, 732, 752, 796–802, 816, 818, 687, 695, 683, 689; 174/51, 16.3; 439/64, 377, 61; 165/80.3, 185; 257/702–727; 74/490.02, 490.01, 490.03, 490.5; 901/2, 14, 15, 16, 19, 49; 248/27.1

(56) References Cited

U.S. PATENT DOCUMENTS

| | | | | |
|---|---|---|---|---|
| D. 348,869 | * | 7/1994 | Egger et al. ........................... 361/383 |
| D. 366,867 | * | 2/1996 | Kurogawa et al. ................. D13/162 |
| 4,497,038 | * | 1/1985 | Diepold-Scharnitsky ........... 364/900 |
| 4,731,703 | * | 3/1988 | Tsukagushi et al. ................. 361/391 |
| 4,772,999 | * | 9/1988 | Fiorina et al. ........................ 363/141 |
| 4,920,453 | * | 4/1990 | Onose et al. .......................... 361/392 |
| 5,095,403 | | 3/1992 | Pin et al. . |
| 5,303,892 | * | 4/1994 | Minder et al. ..................... 248/231.9 |
| 5,436,794 | * | 7/1995 | Clemente et al. ................... 361/704 |
| 5,603,618 | * | 2/1997 | Yasuyoshi et al. .................... 439/64 |
| 5,712,765 | * | 1/1998 | Lehrman et al. .................... 361/704 |
| 5,983,744 | * | 11/1999 | Watanabe et al. ................ 74/490.02 |

FOREIGN PATENT DOCUMENTS

| | | | |
|---|---|---|---|
| 1354308 | 6/1964 | (FR) . | |
| 2697381 | 4/1994 | (FR) . | |
| 2700913 | 7/1994 | (FR) . | |
| 56-108297 | 1/1955 | (JP) . | |
| 1-93785 | 6/1989 | (JP) . | |
| 1-115284 | 8/1989 | (JP) . | |
| 3-45695 | 4/1991 | (JP) . | |
| 408019986 | * 1/1996 | (JP) | ................................ B25J/1/00 |
| 8-250869 | 9/1996 | (JP) . | |
| 410315180 | * 12/1998 | (JP) | ................................ B25J/19/00 |

OTHER PUBLICATIONS

Patent Abstract of Japanese Patent 06204676, Jul. 22, 1994.
Patent Abstract of Japanese Patent 09307252, Nov. 28, 1997.

* cited by examiner

*Primary Examiner*—Leo P. Picard
*Assistant Examiner*—Michael Datskovsky
(74) *Attorney, Agent, or Firm*—Staas & Halsey LLP

(57) ABSTRACT

A base plate (20) is provided in a standing manner on a center portion of one side surface of a front-surface panel (15), a control unit (3) of a servo amplifier is attached to one surface of the base plate (20), and a heat-radiation unit (19) of the servo amplifier is attached to the other surface. The control unit (3) and other electric parts in a cabinet (11) are connected to each other through a connector cable (9). When the front-surface panel (15) is drawn out to release only the connector cable (9), the control unit (3) and the heat-radiation unit (19) of the servo amplifier can be separated from the cabinet (11).

10 Claims, 2 Drawing Sheets

CONTROLLER WITH SERVO AMPLIFIER INCORPORATED IN CABINET

FIELD OF THE INVENTION

The present invention relates to an improvement of a controller having a servo amplifier built in a cabinet.

BACKGROUND

A conventional controller having a servo amplifier built in a cabinet is shown in FIGS. 3 and 4.

A cabinet 1 of the controller is constituted by a rectangular box, and the inner space of the box is divided into forward and backward parts by a partition plate 2 arranged at the center of the inner space. A rectangular opening 5 is formed in the left-side portion of the partition plate 2. In addition, mounting bolts (not shown) are provided in a standing manner on a front surface of the partition plate 2 near four corners of the rectangular opening 5.

Bolt insertion holes 21 are formed at four corners of a rectangular base plate 6 in correspondence with the positions of the mounting bolts. A control unit 3 of a servo amplifier is fixed to the front surface of the base plate 6, and a heat-radiation unit (not shown) of the servo amplifier is fixed to the rear surface. The mounting bolts of the base plate 6 are inserted into the bolt insertion holes 21 of the base plate 6, and the tops of the mounting bolts are fastened by nuts 7. At this time, the base plate 6 is fixed to the partition plate 2 to close the opening 5.

A numeral control unit 4 is attached to a right-side portion on the front surface of the partition plate 2. Therefore, in a state where the base plate 6 having the control unit 3 of the servo amplifier attached to the front surface and the heat-radiation unit of the servo amplifier attached to the rear surface is fixed to the partition plate 2 through the mounting bolts and the nuts 7, the control unit 3 of the servo amplifier and the numeral control unit 4 are arranged in a forward space partitioned by the partition plate 2, and the heat-radiation unit of the servo amplifier is arranged in a backward space. An air-blowing fan (not shown) for exhausting air heated by heat radiated from the heat-radiation unit of the servo amplifier to the outside is arranged in the backward space.

The control unit 3 of the servo amplifier is connected to other electric parts, e.g., the numeral control unit 4, in the cabinet 1 through a direct-mounted cable 8 or a connector cable 9. A panel 10 for performing maintenance operations for the control unit 3 of the servo amplifier and the numeral control unit 4 is attached to the front surface of the cabinet 1 such that the panel 10 can be freely opened and closed.

Since a large number of electric parts which are expandable are mounted on the control unit 3 and the heat-radiation unit of the servo amplifier, maintenance operations for these parts must be performed. For this purpose, the control unit 3 and the heat-radiation unit of the servo amplifier must be detached out of the cabinet 1, however, when the conventional cabinet structure shown in FIG. 3, the opening/closing panel 10 is opened to take the cables 8 and 9 out, meshing of the nuts 7 for fixing the four corners of the base plate 6 is released, so that the control unit 3 and the heat-radiation unit of the servo amplifier are detached out of the cabinet 1 together with the base plate 6. Such cumbersome operations are required.

DISCLOSURE OF THE INVENTION

It is an object of the present invention to provide a controller having a servo amplifier built in a cabinet, which is capable of easily detaching the servo amplifier from the cabinet.

In order to achieve the above object, in a controller having a servo amplifier built in a cabinet, according to the present invention, one surface of the cabinet is constituted by a detachable panel, the servo amplifier is fixed inside the panel, and the servo amplifier and other electric parts arranged in the cabinet are connected through a connector cable.

Preferably, a base plate is provided in a standing manner from an inner central portion of the panel, a control unit of the servo amplifier is fixed to one surface of the base plate, while a heat-radiation unit of the servo amplifier is fixed to the other surface of the base plate, the base plate is engaged with a channel-like engagement portion fixed to a partition plate for partitioning the space in the cabinet into two spaces to form an airtight seal between the two spaces in the cabinet, and a air-blowing fan is arranged in a space in which the heat-radiation unit is located.

According to the present invention, without a cumbersome operation such as attachment/detachment of screws and nuts, attaching/detaching operation of the servo amplifier can be easily performed by only detaching the panel constituting one surface of the cabinet. Also, since an arrangement in which the control unit and heat-radiation unit of the servo amplifier are separated from each other by the partition plate provided in the cabinet and the base plate provided in the standing manner on the detachable panel is employed, the control unit of the servo amplifier can be prevented from being over-heated, dust and dirt carried into the cabinet are prevented from penetrating the control unit by the function of the blowing fan arranged in the heat-radiation unit.

BEST MODE FOR CARRYING OUT THE INVENTION

Figure 1:
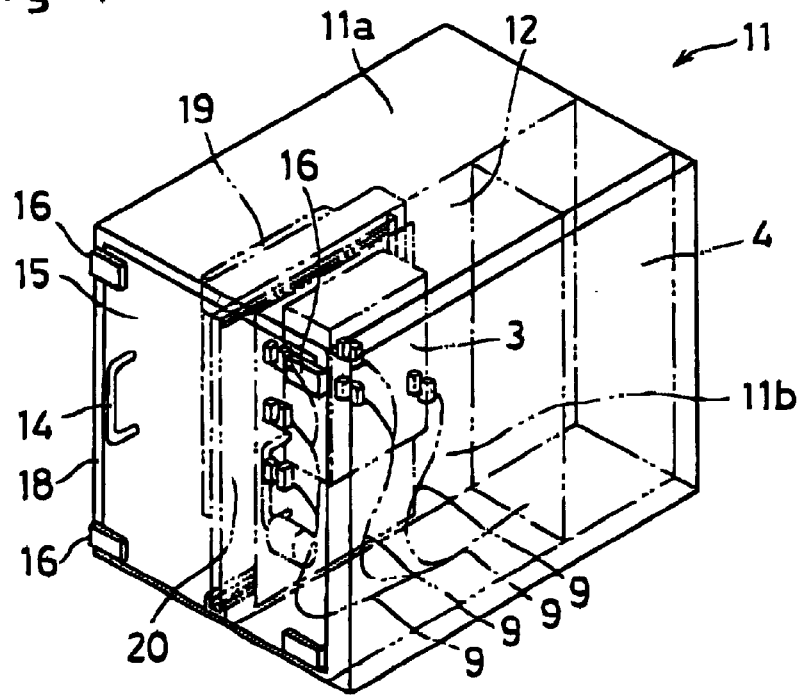
FIG. 1 is a perspective view showing a controller having a servo amplifier built in a cabinet according to an embodiment of the present invention.
Figure 2:
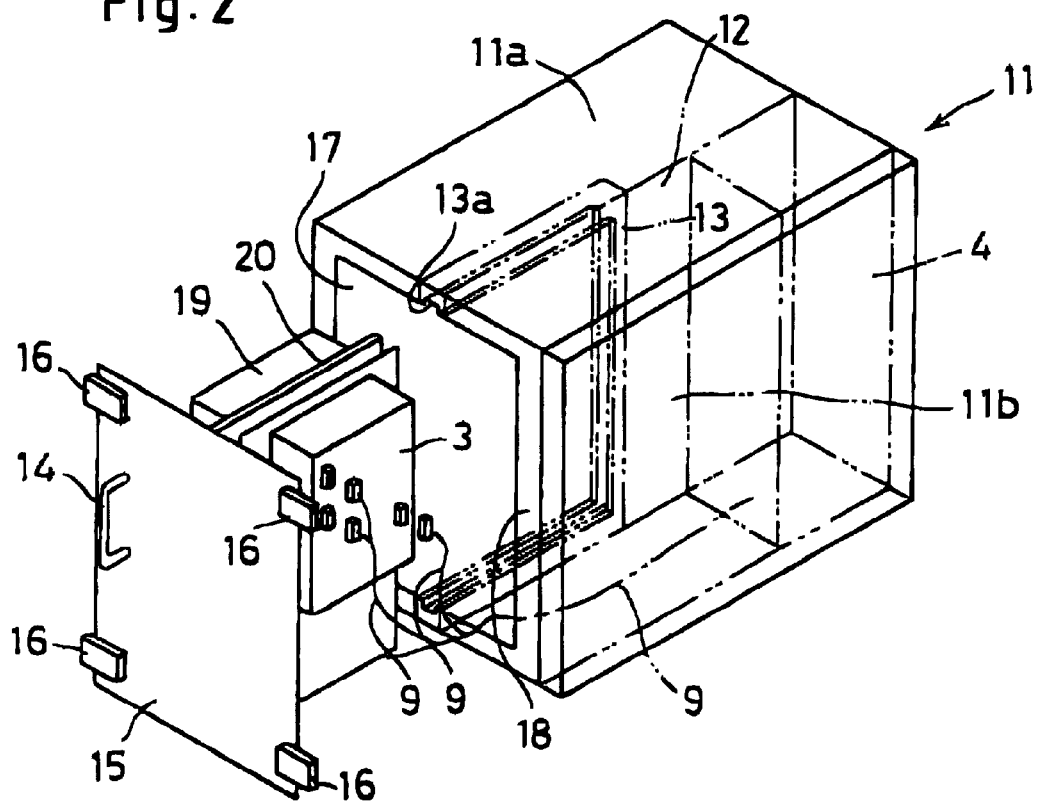
FIG. 2 is a perspective view showing a state in which the servo amplifier is detached out of the cabinet in FIG. 1.
Figure 3:
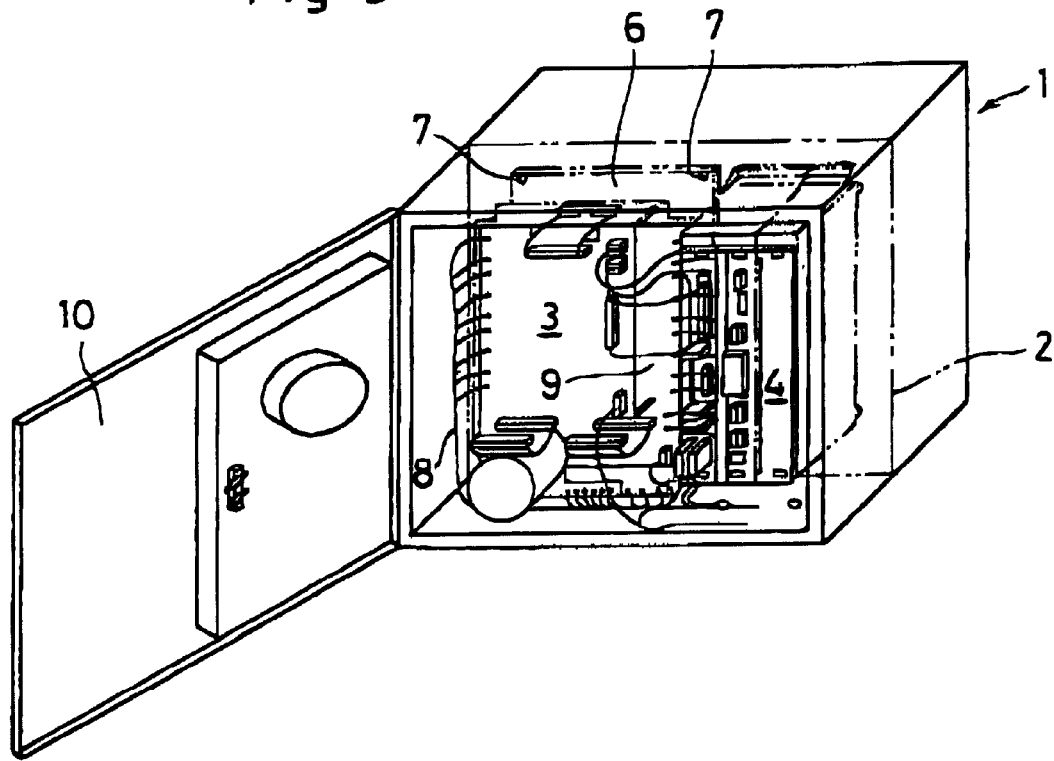
FIG. 3 is a perspective view showing a controller having a servo amplifier built in a cabinet according to a prior art.
Figure 4:
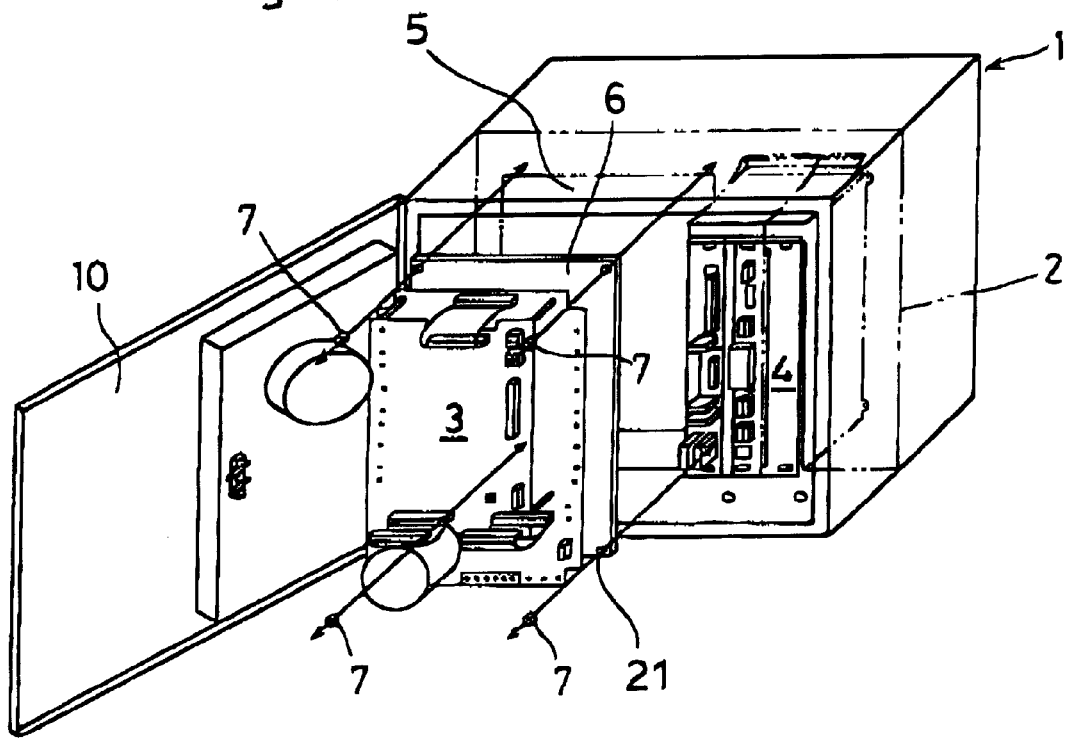
FIG. 4 is a perspective view showing a state in which the servo amplifier is detached out of the cabinet in FIG. 3.

A cabinet 11 of a robot controller, as shown in FIG. 2, is constituted by a rectangular box having an opening 17 formed in its front surface, and an inner space of the box is divided into left and right spaces by a partition plate 12 arranged at a central portion of the inner space. That is, the inner space of the cabinet 11 is divided into a left space 11a and a right space 11b by the partition plate 12 serving as a boundary as viewed from the opening 17.

In a forward portion of the partition plate 12, i.e., in a portion thereof near the opening 17 of the cabinet 11, a rectangular notch is formed. A channel-like engagement portion 13 having a groove 13a having a U-shaped section extending along the edge of the notch is integrally formed on or attached to one surface of the partition plate 12. One end of the engagement portion 13 extends up to the front-surface opening 17 of the cabinet 11. The engagement portion 13 is desirably formed of an elastic material such as hard rubber to achieve dust-proof and moisture-proof properties.

An air-blowing fan and a ventilation hole (not shown) are formed in the left space 11a in the cabinet 11, so that air heated in the space 11a can be exhausted to the outside.

The front-surface opening 17 of the cabinet 11 is covered with a front-surface panel 15 independent of the cabinet 11. Long holes (not shown) extending in lateral direction are formed in four corners of the front-surface panel 15. Engagement portions of simple fixtures 16 pass through the respective long holes to project from the back surface of the front-surface panel 15. The simple fixtures 16 are laterally biased by springs (not shown) on the outer side.

Engagement grooves are formed on the outer sides of the engagement portions of the simple fixtures 16 projecting from the back surface of the front-surface panel 15. The engagement grooves are engaged, from the inside of the contact 11, with the inner folded portions 18 formed around the front-surface opening 17 of the cabinet 11. This engagement state is held by spring biasing.

A base plate 20 for attaching the control unit 3 and a heat-radiation unit 19 (heat sink) of the servo amplifier is provided in a standing manner on a center portion of the back surface of the front-surface panel 15. The base plate 20 is formed in such a size and a shape that its edge can engage with the groove 13a of the engagement portion 13 attached to one surface of the partition plate 12 to completely close the rectangular notch formed in the forward portion of the partition plate 12.

The control unit 3 of the servo amplifier is attached to one surface of the base plate 20, and the heat-radiation unit 19 is attached to the opposite surface. Therefore, in a state where the front-surface panel 15 is attached to the cabinet 11, the control unit 3 of the servo amplifier is placed in the right space 11b, and the heat-radiation unit 19 is placed in the left space 11a. In addition, the inner space of the cabinet 11, as described above, is completely separated into the left space 11a and the right space 11b by the partition plate 12 and the base plate 20. As a result, heat from the heat-radiation unit 19 is prevented from passing from the left space 11a to the right space 11b in which the control unit 3 of the servo amplifier is placed.

A numeral control unit 4 of a robot controller is arranged at an inner position (position where the base plate 20 does not reach) in the right space 11b in the cabinet 11.

In order to attach the front-surface panel 15 to the cabinet 11, the upper and lower edges of a distal portion of the base plate 20 are engaged with the groove 13a of the engagement portion 13, and the front-surface panel 15 is pressed into the cabinet 11. Immediately before the front-surface panel 15 is brought into contact with the front-surface opening 17, the simple fixtures 16 are inwardly pressed with fingers of an operator against the biasing forces of the springs, and then the front-surface panel 15 is further pressed into the cabinet 11. When the fingers are released from the simple fixtures 16 after the front-surface panel 15 is brought into contact with the front-surface opening 17, the simple fixtures 16 move outside by the biasing forces of the springs, and the engagement portions of the simple fixtures 16 located on the back surface of the front-surface panel 15 move toward the folded portions 18 of the cabinet 11. As a result, the outside grooves outside the engagement portion are engaged with the folded portions 18.

On the other hand, in order to remove the front-surface panel 15 from the cabinet 11, the front-surface panel 15 may be separated from the front-surface opening 17 of the cabinet 11 while the simple fixtures 16 are inwardly pressed with the fingers of the operator against the biasing forces of the springs. In this manner, the engagement portions of the simple fixtures 16 located on the back surface of the front-surface panel 15 are retreated from the folded portions 18 of the cabinet 11, and the engagement between the outside grooves of the engagement portions and the folded portions 18 is canceled. In this state, when the front-surface panel 15 is withdrawn, the base plate 20 is removed out of the front-surface opening 17 of the cabinet 11 while the base plate 20 is guided by the groove 13a of the engagement portion 13.

To obtain convenience when an operator holds the front-surface panel 15 with her/his hand to attach or detach the front-surface panel 15 to/from the cabinet 11, a handle 14 is fixed on the front surface of the front-surface panel 15.

When the control unit 3 or the heat-radiation unit 19 constituting the servo amplifier fails, the control unit 3 and the heat-radiation unit 19 can be integrally removed together with the front-surface panel 15 by inwardly pressing the respective simple fixtures 16 inside to withdraw the front-surface panel 15 on the operator's side. Since the connector cable 9 for connecting the control unit 3 of the servo amplifier and other electric parts in the cabinet 1 to each other has a sufficient length, as shown in FIG. 2, the control unit 3 of the servo amplifier can be completely withdrawn out of the cabinet 11 while the connector cable 9 is kept connected, and an operation of removing the connector cable 9 from the control unit 3 can also be extremely easily performed outside the cabinet 11.

After a repair operation required for the control unit 3 and/or the heat-radiation unit 19, the control unit 3 of the servo amplifier and the connector cable 9 are connected to each other again outside the cabinet 11, the edge of the base plate 20 is fitted in the U-shaped groove 13a of the engagement portion 13, and the front-surface panel 15 is directly pressed toward the inside of the cabinet 11. At this time, the front-surface panel 15 is attached to the cabinet 11 by the simple fixtures 16.

If the above operation must be performed in a hurry, the front-surface panel 15 having the disordered control unit 3 and/or heat-radiation unit 19 is directly set in the repair process, and, in place of this front-surface panel, another front-surface panel 15 having a new control unit 3 and/or a new heat-radiation unit 19 or another front-surface panel 15 on which a control unit 3 and/or a heat-radiation unit 19 has already been repaired may be prepared to be attached.

The left space 11a in which the heat-radiation unit 19 of the servo amplifier is located and the right space 11b in which the control unit 3 of the servo amplifier and the numeral control unit 4 are located are completely separated from each other by the partition plate 12 and the base plate 20, as described above, so that, heat from the heat-radiation unit 19 is not transmitted to the control unit 3 and/or the numeral control unit 4. Also, since the blowing fan and the ventilation hole are provided in the left space 11a in which the heat-radiation unit 19 is located to exhaust air warmed in the space 11a to the outside, the heat-radiation unit 19 itself is prevented from being overheated.

What is claimed is:

1. A controller comprising a servo amplifier built in a cabinet, with one surface of the cabinet being constituted by a detachable panel, said servo amplifier being fixed inside the panel on a baseplate partitioning an inner space of the cabinet into two closed spaces, and said servo amplifier, and other electric parts arranged in the cabinet, being connected to each other through a connector cable.

2. A controller, comprising:
   a servo amplifier built in a cabinet, with one surface of the cabinet being constituted by a detachable panel, said servo amplifier being fixed inside the panel, and said servo amplifier, and other electric parts arranged in the cabinet, being connected to each other through a connector cable;

a base plate provided in a standing manner on an inner central portion of the panel;

a control unit of said servo amplifier fixed to one surface of said base plate; and a heat-radiation unit of said servo amplifier fixed to the other surface of the base plate, wherein said base plate is engaged with a channel-like engagement portion fixed to a partition plate for dividing a space in the cabinet into two spaces to airtightly seal the two spaces in the cabinet, with an air-blowing fan arranged in the space in which the heat-radiation unit is located.

3. A controller having a box-like cabinet with an opening in a front surface of the cabinet and a front-surface panel which can seal the opening of the cabinet, comprising:

a servo amplifier;

an engagement portion having a guide groove arranged in the cabinet, one end of said engagement portion extending up to the opening of the front surface; and a base plate fixed to one surface of the front-surface panel with an attitude perpendicular to the front-surface panel, with said base plate having one element constituting said servo amplifier attached to at least one surface of said base plate such that said base plate is engaging the guide groove of said engagement portion attached to an inner wall of the cabinet and partitioning an inner space of the cabinet into two closed spaces, wherein when the front-surface panel is moved toward the front-surface opening of the cabinet an edge of the base plate is engaged with the guide groove of said engagement portion.

4. The controller according to claim 3, wherein the front-surface opening of the cabinet is sealed with the front-surface panel and an edge of said base plate attached to the front-surface panel is engaged with the guide groove of said engagement portion attached to the inner wall of the cabinet.

5. A controller having a box-like cabinet with an opening in a front surface of the cabinet and a front-surface panel which can seal the opening of the cabinet, comprising:

a servo amplifier;

an engagement portion having a guide groove arranged in the cabinet, one end of said engagement portion extending up to the opening of the front surface; and a base plate fixed to one surface of the front-surface panel with an attitude perpendicular to the front-surface panel, with said base plate having one element constituting said servo amplifier attached to at least one surface of said base plate and having such a size that said base plate is engaged with the guide groove of said engagement portion attached to an inner wall of the cabinet, wherein when the front-surface panel is moved toward the front-surface opening of the cabinet an edge of the base plate is engaged with the guide groove of said engagement portion, and wherein fixtures are attached to a plurality of locations in an outer periphery of the front-surface panel such that the fixtures can be projected or retreated from the front surface-panel to the outside, while engagement portions to be engaged with the fixtures projecting to the outside are formed around the front-surface opening of the cabinet.

6. The controller according to claim 4, in which each of said engagement portions are made from elastic material.

7. The controller according to claim 4, wherein a partition plate for dividing an inner space of the cabinet into two is fixed inside the cabinet, a notch is formed in a portion of the partition plate near the front-surface opening of the cabinet, and said engagement portion is fixed to the partition plate along the periphery of the notch.

8. The controller according to claim 7, wherein the one element constituting said servo amplifier is mounted on a side opposing the front-surface opening of the cabinet in at least one of the two inner spaces of the cabinet divided by the partition plate.

9. A controller with a cabinet, comprising:

a detachable panel covering an opening in the cabinet; and a servo amplifier mounted on a base plate attached to said detachable panel, with the base plate having an attitude perpendicular from said detachable panel, wherein the base plate engages guides fixed to the cabinet, and divides the cabinet such that there is no movement of air between the divided portions of the cabinet.

10. The controller according to claim 9, wherein the base plate has said servo amplifier fixed to one side of the base plate and a heat radiation unit fixed to the other side of the base plate.

* * * * *